United States Patent
Kagoyama

(10) Patent No.: US 12,132,084 B2
(45) Date of Patent: Oct. 29, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Yohei Kagoyama, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 401 days.

(21) Appl. No.: 17/706,879

(22) Filed: Mar. 29, 2022

(65) Prior Publication Data

US 2022/0367642 A1    Nov. 17, 2022

(30) Foreign Application Priority Data

May 14, 2021  (JP) ................. 2021-082660

(51) Int. Cl.
  *H01L 29/66*  (2006.01)
  *H01L 21/02*  (2006.01)
  *H01L 29/16*  (2006.01)
  *H01L 29/78*  (2006.01)

(52) U.S. Cl.
  CPC .... *H01L 29/1608* (2013.01); *H01L 21/02378* (2013.01); *H01L 21/02529* (2013.01); *H01L 29/66068* (2013.01); *H01L 29/7802* (2013.01)

(58) Field of Classification Search
  CPC ........... H01L 29/1608; H01L 21/02378; H01L 29/66068; H01L 29/7802; H01L 21/02529; H01L 21/02433; H01L 21/02167; H01L 21/02447; H01L 29/1095; H01L 29/7813; H01L 2223/5446
  See application file for complete search history.

(56) References Cited

U.S. PATENT DOCUMENTS

| | | | |
|---|---|---|---|
| 2007/0090370 A1 | 4/2007 | Nakayama et al. | |
| 2015/0349062 A1* | 12/2015 | Konstantinov | ..... H01L 29/7811 257/77 |
| 2021/0167173 A1* | 6/2021 | Fujimoto | ............ H01L 21/046 |

FOREIGN PATENT DOCUMENTS

| | | | |
|---|---|---|---|
| JP | 2005-167035 A | 6/2005 | |
| JP | 2009-010120 A | 1/2009 | |
| WO | WO-2016170706 A1 * | 10/2016 | ............ H01L 22/14 |

* cited by examiner

*Primary Examiner* — Niki H Nguyen
(74) *Attorney, Agent, or Firm* — Rabin & Berdo, P.C.

(57) ABSTRACT

A type, size, and location of a crystal defect of an epitaxial layer of a semiconductor wafer containing silicon carbide are detected from a PL image by crystal defect inspection equipment. Detected crystal defects include a triangular polymorph stacking fault generated in the epitaxial layer during epitaxial growth and high-density BPDs extending from the stacking fault and present bundled between the stacking fault and a perfect crystal. Next, a chip region free of the triangular polymorph stacking fault and free of the high-density BPD in a specified area that is in the termination region and is located closer to a chip center than is a specified position is identified as a conforming product. A semiconductor chip set as a conforming product may contain high-density BPDs outside the specified area.

12 Claims, 13 Drawing Sheets

FIG.8

| | BREAKDOWN VOLTAGE | THICKNESS t1 OF DRIFT REGION | HOLE DIFFUSION DISTANCE w2 | CURRENT | JUNCTION TEMPERATURE | DUTY RATIO | CONDUCTION TIME |
|---|---|---|---|---|---|---|---|
| FIRST SAMPLE | 1.2kV | 10μm | 137μm | 54.5A | 155°C | 5% | 5hr |
| SECOND SAMPLE | 1.2kV | 10μm | 136μm | 200A | 180-200°C | 5% | 5hr |
| THIRD SAMPLE | 1.7kV | 15μm | 145μm | 27A | 155°C | 10% | 1hr |
| FOURTH SAMPLE | 3.3kV | 31μm | 231μm | 200A | 180°C | 5% | 5hr |
| FIFTH SAMPLE | 3.3kV | 31μm | 241μm | 30A | 155°C | 20% | 1hr |

FIG.9

| | BREAKDOWN VOLTAGE | THICKNESS t1 OF DRIFT REGION | HOLE DIFFUSION DISTANCE w2 | LENGTH w1 OF EDGE TERMINATION REGION | RATIO OF HOLE DIFFUSION DISTANCE (w2/w1) |
|---|---|---|---|---|---|
| FIRST SAMPLE | 1.2kV | 10μm | 137μm | 240μm | 57% |
| THIRD SAMPLE | 1.7kV | 15μm | 145μm | 270μm | 54% |
| FOURTH SAMPLE | 3.3kV | 31μm | 231μm | 500μm | 46% |

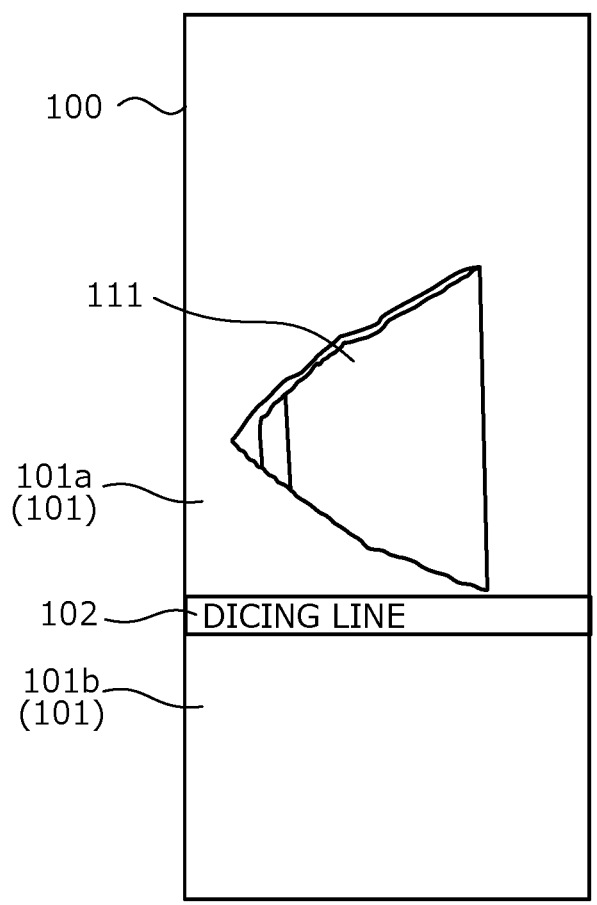

PL IMAGE

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-082660, filed on May 14, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a metal oxide semiconductor field effect transistor containing silicon carbide (SiC) as a semiconductor material (SiC-MOSFET) and having insulated gates with a 3-layer structure including a metal, an oxide film, and a semiconductor, a semiconductor chip is used in which epitaxial layers constituting an $n^-$-type drift region and a p-type base region are sequentially formed by epitaxial growth on a starting substrate that is an $n^+$-type and contains silicon carbide. In the epitaxial layers of the semiconductor chip, basal plane dislocations (BPDs) due to process damage, propagation from the starting substrate, etc. occur during the epitaxial growth.

When a parasitic diode (body diode) formed by a pn junction between the p-type base region and the $n^-$-type drift region formed in the epitaxial layers conducts, minority carriers (holes) injected into the $n^-$-type drift region due to bipolar operation of the body diode recombine with electrons. When recombination occurs near a BPD, a Shockley stacking fault originating from the BPD grows (expands) in the epitaxial layer, forward characteristics of the body diode degrade, and on-voltage characteristics of the MOSFET degrade. Thus, an n-type buffer region (epitaxial layer) is disposed between the starting substrate and the $n^-$-type drift region, whereby holes that reach a BPD from a pn junction are reduced and the growth of Shockley stacking faults is suppressed.

As for a conventional silicon carbide semiconductor device, a device has been proposed in which epitaxial layers constituting an $n^-$-type drift region, a $p^+$-type anode region, and a $p^{++}$-type high-doped region are sequentially stacked on a starting substrate constituting an $n^+$-type cathode region (for example, refer to Japanese Laid-Open Patent Publication No. 2009-010120). In Japanese Laid-Open Patent Publication No. 2009-010120, electrons penetrating from the $n^-$-type drift region and not trapped by holes in the $p^+$-type anode region are trapped by holes in the $p^{++}$-type high doped region before reaching a vicinity of a front surface of the semiconductor chip (surface having the $p^{++}$-type high doped region), whereby recombination of electrons and holes near defect nuclei often localized near the front surface is suppressed, an occurrence of stacking faults originating from the defect nuclei is suppressed, and forward voltage increases of a bipolar semiconductor device are suppressed.

Further, as for another silicon carbide semiconductor device, a device has been proposed in which a surface having an off-angle θ of 8 degrees with respect to a C-plane (carbon-face) of a starting substrate containing silicon carbide is regarded as crystal growth plane and on this growth plane, epitaxial layers constituting a buffer region, a drift region, etc. are epitaxially grown at a growth rate (amount of increase in thickness) per 1 hour (h) of at least 10 μm/h (for example, refer to Japanese Laid-Open Patent Publication No. 2005-167035). In Japanese Laid-Open Patent Publication No. 2005-167035, the growth rate of the epitaxial layers is at least 3 times faster than that conventionally and critical saturation of the C-face is relatively increased, whereby propagation of basal plane dislocations that constitute growth origins of stacking defaults is suppressed and degradation of forward characteristics of a bipolar semiconductor device is suppressed.

SUMMARY OF THE INVENTION

According to an embodiment of the invention, a method of manufacturing a vertical silicon carbide semiconductor device on one of a plurality of semiconductor chips in which an epitaxial layer is epitaxially grown on a starting substrate containing silicon carbide, the semiconductor chips each having two main surfaces opposite to each other, the vertical silicon carbide semiconductor device having an electrode on each main surface of each semiconductor chip, the method includes: as a preprocess, preparing a semiconductor wafer in which the epitaxial layer is epitaxially grown on a starting wafer that contains silicon carbide and constitutes the starting substrate; as a detection process, detecting a crystal defect of the epitaxial layer; as a formation process, forming a predetermined device element structure on the semiconductor wafer; as a cutting process, dicing the semiconductor wafer into the plurality of semiconductor chips after the formation process; and as a first identification process, identifying one or more chips as a conforming product, based on a result of the detection process. Each of the plurality of semiconductor chips has: an active region in which the device element structure is provided, and a termination region surrounding a periphery of the active region. The detection process includes detecting, in the epitaxial layer, a stacking fault and a basal plane dislocation (BPD) extending from the stacking fault. The first identification process includes identifying, as a conforming product, the one or more chips that are entirely free of the stacking fault and are free of the BPD in a specified area set in advance, the specified area being an area in the termination region and being located closer to a chip center than is a specified position.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a table of measurement results for a hole diffusion distance in experimental examples.

FIG. 9 is a table of calculation results for hole diffusion distance ratios in the experimental examples.

FIG. 11A is a diagram schematically depicting a state when a crystal defect detected in the semiconductor wafer is observed from a front surface (surface of epitaxial layer side) side.

DETAILED DESCRIPTION OF THE INVENTION

First, problems associated with the conventional techniques are discussed. In a conventional SiC-MOSFET, holes injected from a p$^+$-type contact region and passing through a main junction (pn junction) during body diode conduction recombine with electrons in the n-type buffer region and disappear. In an instance in which a Shockley-type BPD is present, extending from the hole injection source (p$^+$-type contact region) and beyond the n-type buffer region (n$^+$-type drain region), hole injection is suppressed by the n-type buffer region and holes have a difficult time reaching a vicinity of the BPD, whereby degradation of on-voltage characteristics of the MOSFET is suppressed. On the other hand, when a Shockley-type BPD is present in the n$^-$-type drift region, injection of holes near the BPD are not suppressed and therefore, a Shockley stacking fault originating from the BPD grows in the n$^-$-type drift region and the on-voltage characteristics of the MOSFET degrade.

Figure 11B:
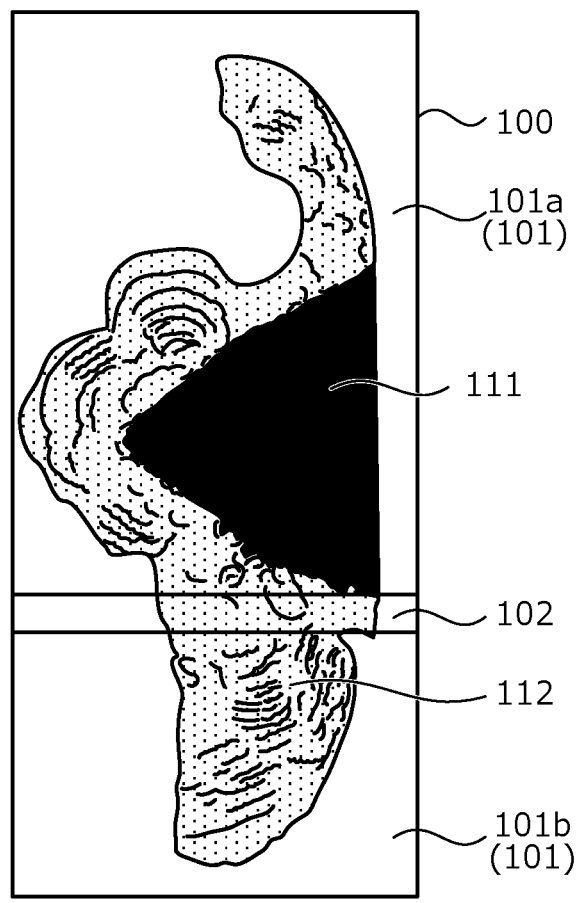
FIG. 11B is a diagram schematically depicting a state when the crystal defect detected in the semiconductor wafer is observed from the front surface (surface of epitaxial layer side) side.

A Shockley-type BPD generated in the n$^-$-type drift region corresponds to a stacking default associated with high-density BPDs, among multiple types of stacking faults newly generated in an epitaxial layer during epitaxial growth. FIGS. 11A and 11B are diagrams schematically depicting states when a crystal defect detected in the semiconductor wafer is observed from a front surface (surface of epitaxial layer side) side. FIGS. 11A and 11B show, respectively, a differential interference contrast (DIC) image and a photo luminescence (PL) image of a triangular polymorph (crystal polymorph) stacking fault 111 detected by crystal defect inspection equipment.

The triangular polymorph stacking fault 111 is newly generated in the epitaxial layer due to polymorph inclusion during epitaxial growth and is associated with high-density BPDs 112 nearby. The high-density BPDs 112 are BPDs present in a bundle at a border between the triangular polymorph stacking fault 111 and perfect crystal (epitaxial layer of single crystal SiC). The high-density BPDs 112 propagate (expand) in a <1-100> direction in the epitaxial layer during epitaxial growth. Therefore, depending on the location where the triangular polymorph stacking fault 111 is generated, penetration into a chip region 101 (101b) adjacent to a chip region 101 (101a) in which the stacking fault 111 is generated may occur.

Conventionally, surface abnormalities of a semiconductor wafer 100 are detected by a DIC image from the crystal defect inspection equipment and chip regions 101 that conform/do not conform are identified by a presence/absence of a surface abnormality. As depicted in FIG. 11A, only an abnormality (unevenness of the surface) appearing at the surface of the semiconductor wafer 100 is observed in the DIC image. All the chip regions 101a (upper portion from a dicing line 102) in which a surface abnormality such as the triangular polymorph stacking fault 111 is detected are removed as non-conforming chips. The chip region 101b (lower portion from the dicing line 102) in which no surface abnormality is detected slips into the market as a conforming product (conforming chip) even when the high-density BPDs 112 are propagated therein from the chip region 101a adjacent thereto.

As depicted in FIG. 11B, an abnormality in the semiconductor wafer 100 is observed in the PL image. In the PL image, the triangular polymorph stacking fault 111 generated in the said chip region 101a, the high-density BPDs 112 generated in a periphery of the stacking fault 111, and a state in which the high-density BPDs 112 are propagated from the chip region 101a, into the chip region 101b adjacent thereto can be detected. The chip region 101 is a portion constituting an individual semiconductor chip into which the semiconductor wafer 100 is diced (cut). The chip region 101 has a substantially rectangular shape in a plan view thereof and is disposed in a matrix-like pattern. The dicing line 102 is formed at borders between adjacent chip regions of the chip regions 101.

Earnest research by the inventor confirmed that the high-density BPDs 112 may become origins of growth of Shockley stacking faults during body diode conduction and may cause increased leak current Idss during long periods of operation of the MOSFET, etc. Therefore, while all the chip regions 101b in which the high-density BPDs 112 are detected are assumed to be removed as non-conforming chips, when all the chip regions 101b into which even a small amount of the high-density BPDs 112 have propagated are removed as non-conforming chips, yield decreases. Therefore, of the chip regions 101b in which the high-density BPDs 112 are detected, it is desirable to identify, as conforming products, the chip regions 101b for which reliability has not decreased while preventing the chip regions 101b for which reliability may decrease from slipping into the market.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
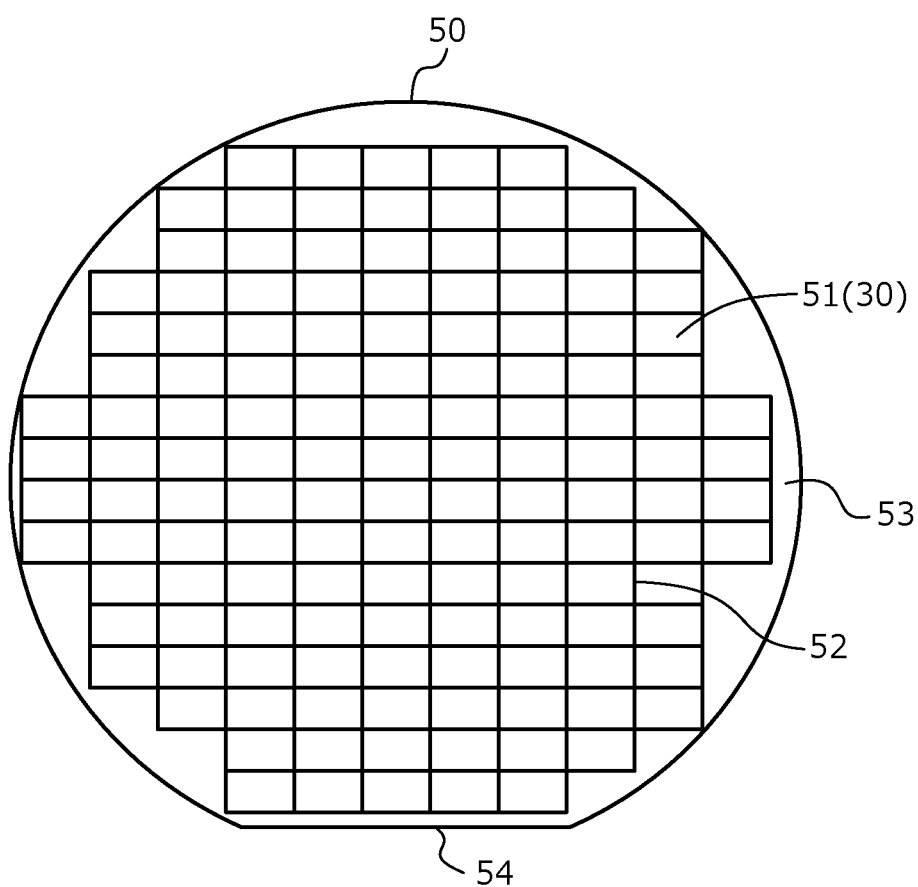
FIG. 1 is a plan view depicting a layout when a semiconductor wafer in which a silicon carbide semiconductor device according to an embodiment is manufactured (fabricated) is viewed from a front side thereof.
Figure 2:
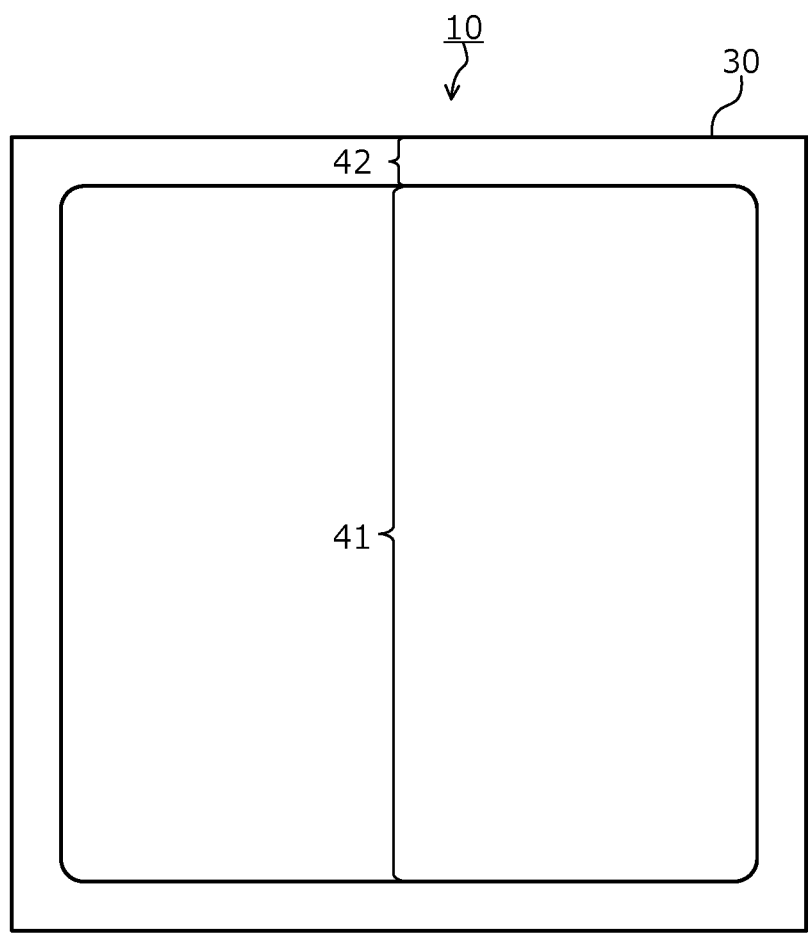
FIG. 2 is a plan view depicting a layout when a semiconductor chip cut from the semiconductor wafer in FIG. 1 is viewed from a front side thereof.
Figure 3:
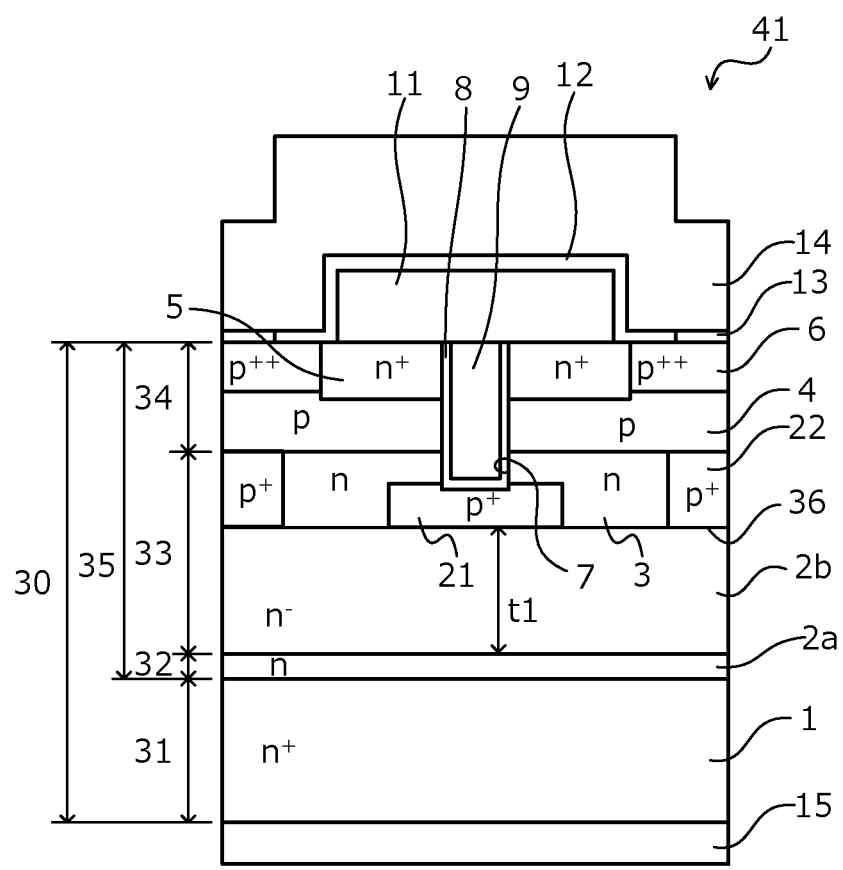
FIG. 3 is a cross-sectional view depicting an example of a structure of an active region and an edge termination region in FIG. 2.
Figure 4:
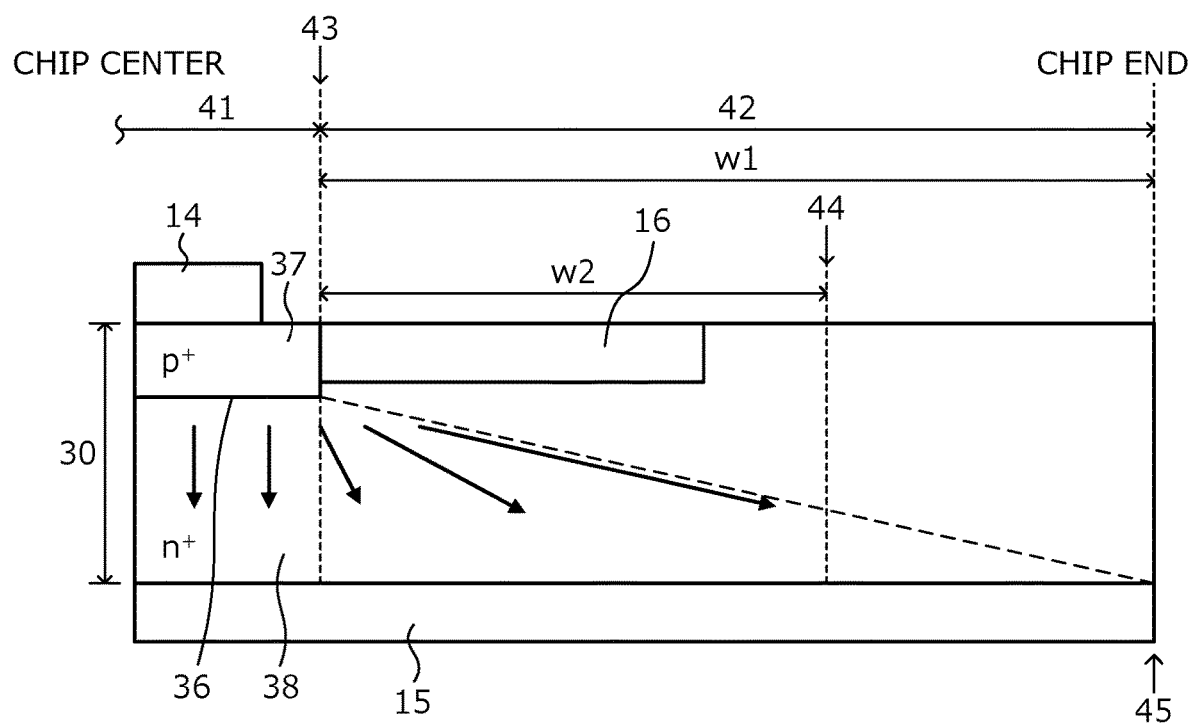
FIG. 4 is a cross-sectional view depicting an example of a structure of the active region and the edge termination region in FIG. 2.

FIG. 1 is a plan view depicting a layout when a semiconductor wafer in which a silicon carbide semiconductor device according to an embodiment is manufactured (fabricated) is viewed from a front side thereof. FIG. 2 is a plan view depicting a layout when a semiconductor chip cut from the semiconductor wafer in FIG. 1 is viewed from a front side thereof. FIG. 2 depicts a state after cutting one chip region 51 of a semiconductor wafer 50 in FIG. 1, FIGS. 3 and 4 are each cross-sectional views depicting examples of a structure of an active region and an edge termination region in FIG. 2. In FIG. 4, a main junction (pn junction 36) of the MOSFET in FIG. 3 is simplified and depicted as the pn junction 36 between a p$^+$-type region 37 and an n$^+$-type region 38.

A silicon carbide semiconductor device 10 according to the embodiment depicted in FIGS. 2 and 3 is fabricated (manufactured), by a general method of manufacturing, in each of the chip regions 51 of the semiconductor wafer 50 that contains silicon carbide (SIC) as a semiconductor material (refer to FIG. 1), and the chip regions 51 are cut into individual semiconductor chips (semiconductor substrates) 30. The semiconductor wafer 50 is formed by epitaxially growing an epitaxial layer (portion constituting an epitaxial layer 35 in FIG. 3 after dicing) on an n$^+$-type starting substrate (portion constituting an n$^+$-type starting substrate 31 in FIG. 3 after dicing) containing silicon carbide.

The semiconductor wafer 50 may have, for example, an orientation flat (linear notch provided at an edge) 54 or a notch (V-shaped notch provided in a portion of the edge, not depicted) indicating plane orientation. The chip regions 51 of the semiconductor wafer 50 are cut (diced) along the dicing lines 52 into the individual semiconductor chips 30. All the semiconductor chips 30 cut from the same semiconductor wafer 50 have the same epitaxial layer 35 (refer to FIG. 3), and have the same device element structure (herein, trench structure, refer to FIG. 3) formed by the same processes.

The chip region 51 has a substantially rectangular shape in a plan view thereof and is disposed in plural in a matrix-like pattern in a substantially center portion of the semiconductor wafer 50. An adjacent two of the chip regions 51, for example, are disposed so as to share one edge. The dicing lines 52 are formed at a border between the adjacent two of the chip regions 51, The dicing lines 52 surround peripheries of the chip regions 51 in a grid-like pattern. The dicing lines 52 are grooves formed at a main surface (surface having the epitaxial layer 35 in FIG. 3) of the semiconductor wafer 50. In the dicing lines 52, marks (location identifying marks, not depicted) for identifying locations (coordinates) in directions parallel to the surface of the semiconductor wafer 50 are formed.

The location identifying marks are marks for identifying locations of the chip regions 51, locations of crystal defects, etc. The location identifying marks, for example, are protrusions or recesses having a predetermined shape (for example, a cross-shape) formed in the dicing lines 52 by etching. The location identifying marks may be provided in a dead region 53 of the semiconductor wafer 50. The dead region 53 is a portion of the semiconductor wafer 50 between an end of the semiconductor wafer 50 and the chip regions 51 closest to the end of the semiconductor wafer 50, a portion not used as the semiconductor chips 30. An alignment mark for positioning (aligning) parts of the device element structure formed in the chip regions 51 may be used as the location identifying mark.

The silicon carbide semiconductor device 10 according to the embodiment depicted in FIGS. 2 and 3, for example, is an n-channel-type vertical MOSFET having, in an active region 41, a trench gate structure on a front side of the semiconductor chip 30 that contains silicon carbide. The active region 41 is a region through which a main current (drift current) flows when the silicon carbide semiconductor device 10 (MOSFET) is in an on-state and in which multiple unit cells (functional units of the device element) of the MOSFET are disposed adjacent to one another, the unit cells each having a same structure. FIG. 3 depicts one unit cell of the MOSFET. The active region 41, for example, is disposed in substantially a center (chip center) of the semiconductor chip 30 and a periphery of the active region 41 is surrounded by an edge termination region 42.

The edge termination region 42 is a region between the active region 41 and an end of the semiconductor chip 30 (chip end). The edge termination region 42 has a function of mitigating electric field of a front side of the semiconductor chips 30 and sustaining a breakdown voltage. The breakdown voltage is a voltage limit at which no erroneous operation or destruction of the silicon carbide semiconductor device 10 occurs and leak current does not increase excessively. The breakdown voltage is determined by an impurity concentration and a thickness t1 of an n$^-$-type drift region 2b. The thickness t1 of the n$^-$-type drift region 2b is a distance from later-described p$^+$-type regions 21, 22 to an n-type buffer region 2a (in an instance in which the n-type buffer region 2a is omitted, an n$^+$-type drain region 1).

A length (distance from the active region 41 to the chip end) w1 of the edge termination region 42 is determined based on the thickness t1 of the n$^-$-type drift region 2b, a rated breakdown voltage, and a voltage withstanding structure 16 so that voltage applied to the edge termination region 42 is at most a predetermined voltage. The rated breakdown voltage is a voltage applied to the active region 41 and is a usage voltage limit for which performance of the silicon carbide semiconductor device 10 may be guaranteed. A border 43 between the active region 41 and the edge termination region 42 is an outermost (chip end side) end position of the later-described pn junction 36 and in particular, is position of an outer end portion of a later-described outermost one of the p$^+$-type regions 22 (in FIG. 4, indicated with other p-type regions collectively as the singular p$^+$-type region 37).

In the edge termination region 42, the voltage withstanding structure 16 such as a field limiting ring (FLR) structure, a junction termination extension (JTE) structure; etc. is disposed between a later-described specified position 44 and a border between the active region 41 and the edge termination region 42. A position of an outer end of the voltage withstanding structure 16 disposed in the edge termination region 42 is the specified position 44. In other words, in an instance in which the voltage withstanding structure 16 is a FLR structure or a JTE structure, the position of the outer end of an outermost p-type region of the p-type regions configuring the voltage withstanding structure 16 is the specified position 44.

The trench structure is configured by a p-type base region 4, n$^+$-type source regions 5, p$^{++}$-type contact regions 6, trenches 7, gate insulating films 8, and gate electrodes 9. In the semiconductor chip 30, epitaxial layers 32, 33, 34 constituting the n-type buffer region 2$a$, the n$^-$-type drift region 2$b$, and the p-type base region 4, respectively, are sequentially grown epitaxially on a front surface of the n$^+$-type starting substrate 31 that contains silicon carbide (in FIG. 3, these epitaxial layers are collectively indicated by reference numeral 35). A surface of the epitaxial layer 35 is a main surface of and assumed to be a front surface of the semiconductor chip 30 while a surface of the n$^+$-type starting substrate 31 (back surface of the n$^+$-type starting substrate 31) is a main surface and assumed to be a back surface of the semiconductor chip 30.

Figure 6:
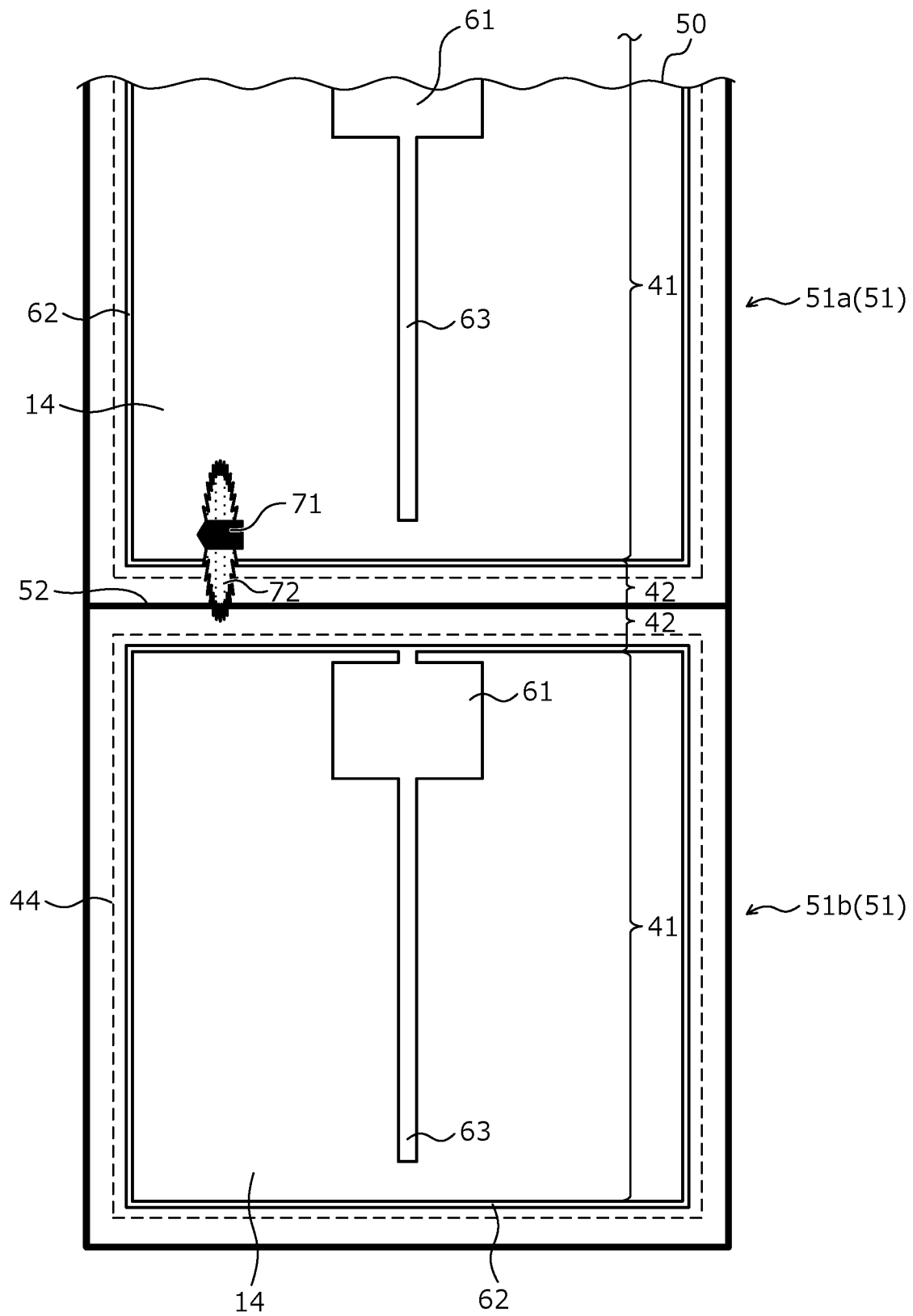
FIG. 6 is a diagram schematically depicting shapes of crystal defects detected by a process at step S3 in FIG. 5.
Figure 7:
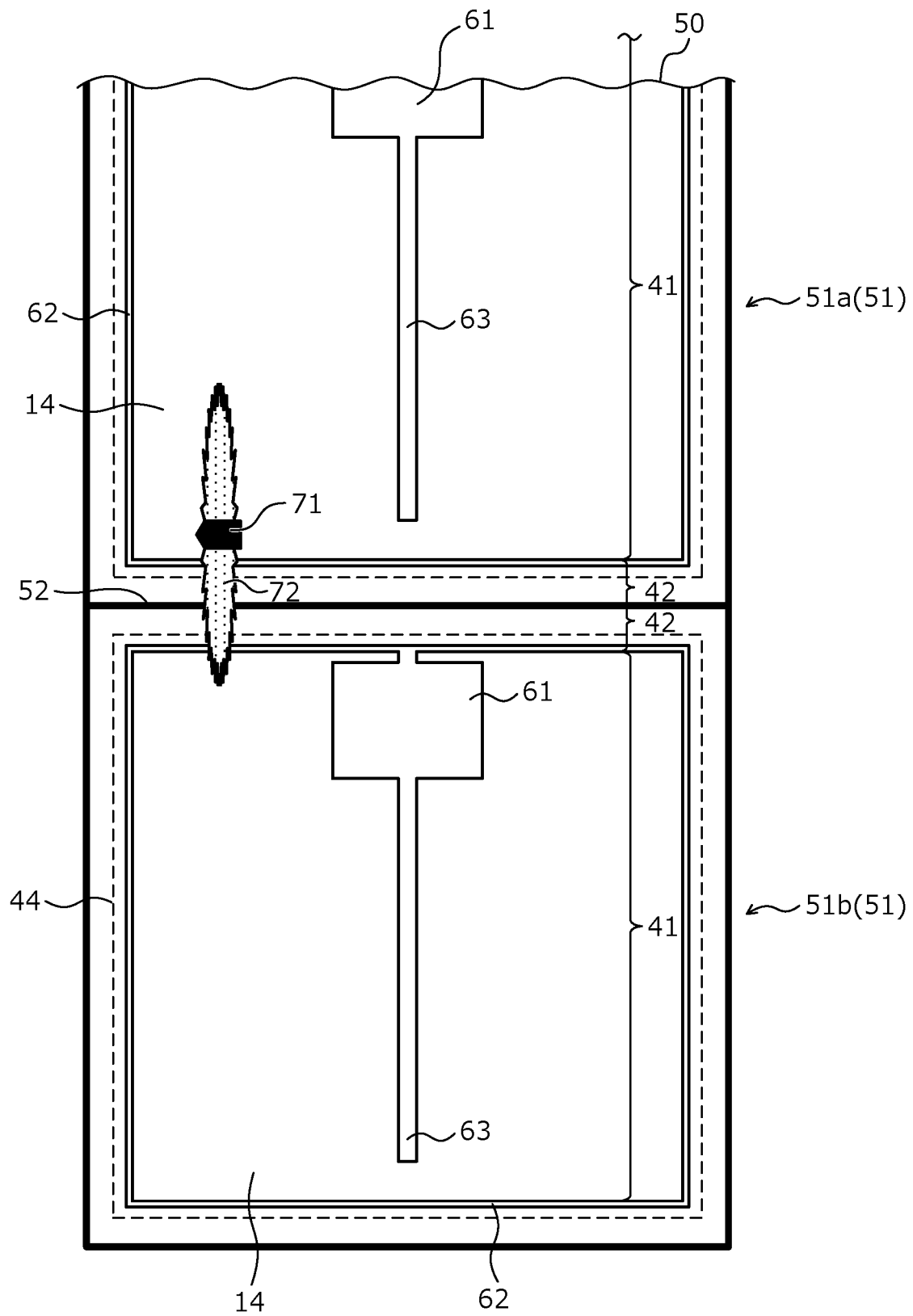
FIG. 7 is a diagram schematically depicting shapes of crystal defects detected by the process at step S3 in FIG. 5.
Figure 10A:
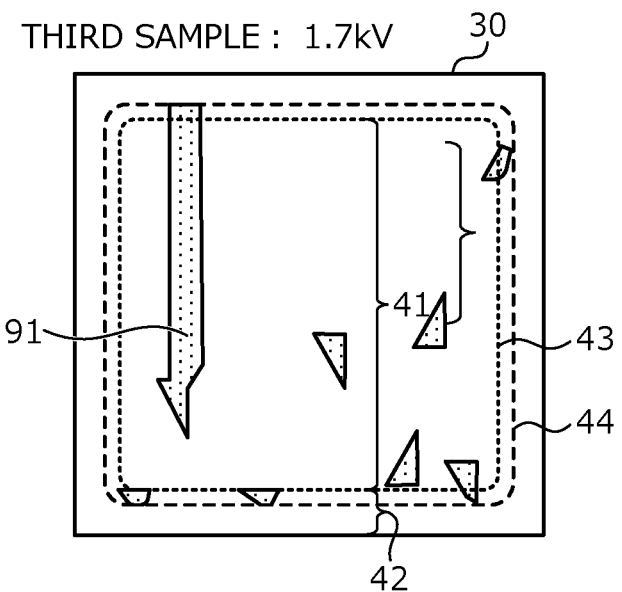
FIG. 10A is a diagram schematically depicting a state when a range in which Shockley stacking faults grow in the experimental examples is observed from the front side of the semiconductor chip.
Figure 10B:
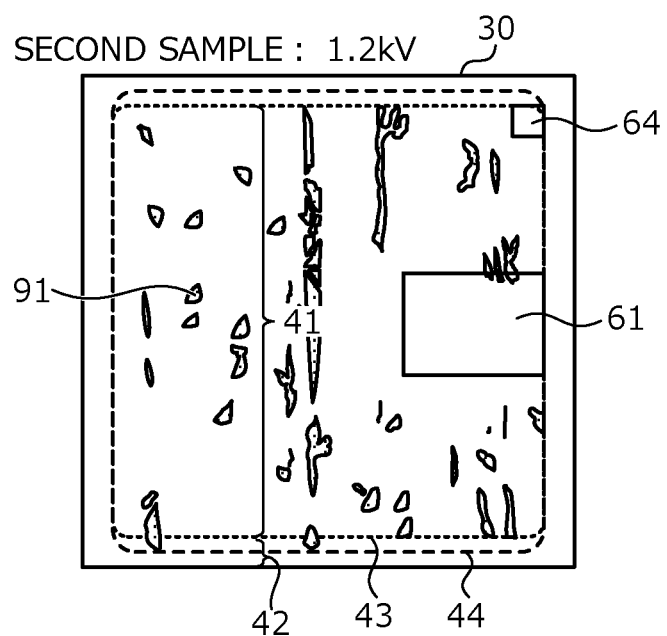
FIG. 10B is a diagram schematically depicting a state when a range in which Shockley stacking faults grow in the experimental examples is observed from the front side of the semiconductor chip.
Figure 10C:
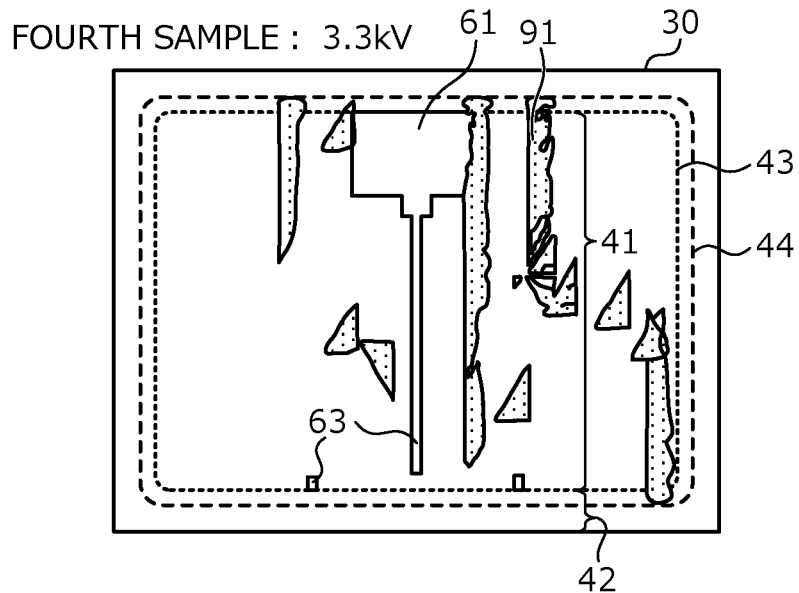
FIG. 10C is a diagram schematically depicting a state when a range in which Shockley stacking faults grow in the experimental examples is observed from the front side of the semiconductor chip.
Figure 10D:
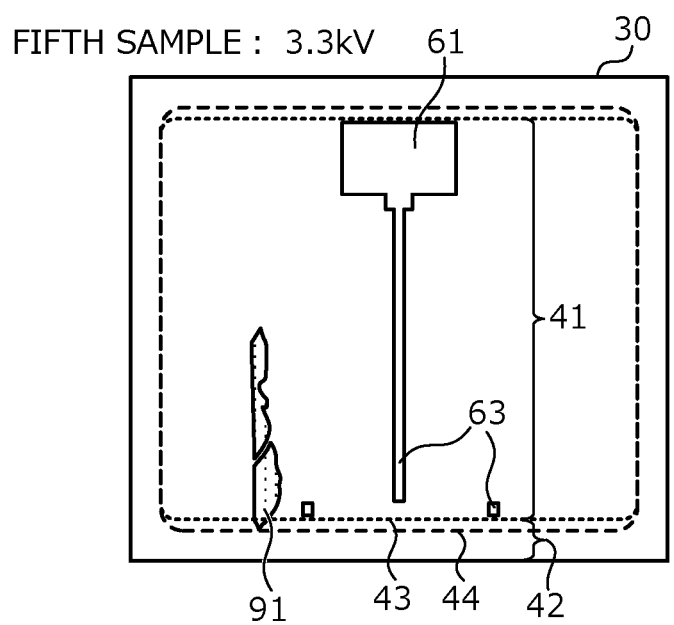
FIG. 10D is a diagram schematically depicting a state when a range in which Shockley stacking faults grow in the experimental examples is observed from the front side of the semiconductor chip.

The semiconductor chip 30 is free of a triangular polymorph stacking fault 71 detected via a photo luminescence (PL) image or a differential interference contrast (DIC) image from crystal defect inspection equipment (refer to FIGS. 6 and 7). The semiconductor chip 30 is free of high-density BPDs 72 detected via the PL image by the crystal defect inspection equipment, in an entire area of the active region 41 and in a portion spanning from the border 43 between the active region 41 and the edge termination region 42 to a position (hereinafter, specified position) 44 that is a predetermined distance w2 from the border 43, in a direction toward the chip end and parallel (horizontal direction) to the front surface of the semiconductor chip 30 (refer to FIGS. 6 and 7). The semiconductor chip 30 may contain the high-density BPDs 72 in a portion that is closer to the chip end than is the specified position 44.

The crystal defect inspection equipment, for example, is the SiC Wafer Inspection and Review System SICA88 manufactured by Lasertec Corporation. The triangular polymorph stacking fault 71 is a triangular stacking fault is newly generated in the epitaxial layer 35 due to a polymorph inclusion during epitaxial growth and is associated with the high-density BPDs 72 nearby. The triangular polymorph stacking fault 71 is a killer defect that causes significant reductions in tolerance capability, reliability, and electrical characteristics of the silicon carbide semiconductor device 10. Therefore, the semiconductor chips 30 being free of the triangular polymorph stacking fault 71 is assumed as a conforming product standard.

The high-density BPDs 72 are a BPD loop present at a border between the triangular polymorph stacking fault 71 and perfect crystal (single crystal SiC of the epitaxial layer 35). The BPD loop is constituted by a BPD that extends from the triangular polymorph stacking fault 71 so that 2 sites of the stacking fault 71 are connected. The BPD loop configuring the high-density BPDs 72 spreads bundled from multiple sites of the triangular polymorph stacking fault 71, in a wave-like shape, and includes threading edge dislocations (TEDs) and threading screw dislocations (TSDs).

While the high-density BPDs 72 are origins of growth (expansion) of Shockley stacking faults during conduction (forward direction) of a parasitic diode (body diode) formed by the main junction (the pn junction 36) of the MOSFET and cause increases of the leak current Idss during long operating periods of the MOSFET, by the earnest research by the inventor, it was newly discovered that when the high-density BPDs 72 are positioned closer to the chip end than is the specified position 44 of the semiconductor chip 30, the high-density BPDs 72 do not cause these problems. The specified position 44 is a position that, in the horizontal direction toward the chip end, is the distance (specified distance) w2 from the border 43 between the active region 41 and the edge termination region 42 (w2=w1×0.6), the distance w2 being about 60% of the length w1 of the edge termination region 42.

A reason that the specified position 44 of the semiconductor chip 30 is set to the described position is as follows. During body diode conduction, hole current (indicated by arrow in FIG. 4) flows from a front electrode 14, through the pn junction 36, a later-described n-type current spreading region 3, the n$^-$-type drift region 2$b$, the n-type buffer region 2$a$, and the n$^+$-type drain region 1 (in FIG. 4, these n-type regions are collectively depicted as the singular n$^+$-type region 38), to a back electrode 15. The back electrode 15 is provided in an entire area of the back surface of the semiconductor chip 30, whereby the hole current flows not only in the active region 41 but also in the edge termination region 42 and reaches an end 45 of the back electrode 15.

Electric field applied to the semiconductor chip 30 weakens with increasing proximity to the chip end of the semiconductor chip 30 and hole density of the hole current that flows during body diode conduction decreases. The described hole current flows so as to spread outward from the active region 41 during body diode conduction, and a limit position that the hole current reaches having a hole density high enough to contribute to Shockley stacking fault growth is a position that, in the horizontal direction toward the chip end, is the distance w2 from the border 43 between the active region 41 and the edge termination region 42, the distance w2 being about 60% of the length w1 of the edge termination region 42. This limit position is assumed to be the specified position 44 and the semiconductor chip 30 being free of the high-density BPDs 72 in a portion in or closer to the chip center than is the specified position 44 is assumed to be a conforming product standard. In other words, the specified distance between the border 43 and the specified position 44 is equal to a maximum length from the pn junction that the hole current reaches with maintaining a minimum hole density that enables the hole current to contribute to Shockley stacking fault growth originating at the BPD. That is, in the edge termination region 42, an area that is located closer to the chip center than is the specified position 44 in the plan view of the silicon carbide semiconductor device 10 can be defined as a specified area, and the specified area is free of the high-density BPDs 72. Outside the specified area, i.e., an area that is located farther from the chip center than is the specified position may include the high-density BPDs 72.

Provided the high-density BPDs 72 are positioned between the chip end and the specified position 44 (up to a position that is a distance equivalent to about 40% of the length w1 of the edge termination region 42 in the horizontal direction toward the chip center, from the chip end), regardless of depth positions of the high-density BPDs 72, a hole injection amount (hole density) necessary for growth of a Shockley stacking fault is not supplied and therefore, the high-density BPDs 72 do not become origins of Shockley stacking fault growth. Further, the high-density BPDs 72, which include TEDs and TSDs, are generated overlapping the voltage withstanding structure 16, whereby the leak current Idss is thought to increase. Provided the high-density BPDs 72 are positioned between the chip end and the specified position 44, the high-density BPDs 72 do not overlap the voltage withstanding structure 16 and therefore, do not cause increases in the leak current Idss.

The $n^+$-type starting substrate 31 is the $n^+$-type drain region 1. The n-type buffer region 2a has a function of preventing minority carriers (holes) generated at an interface of the pn junction 36 during body diode conduction, from reaching the $n^+$-type starting substrate 31 by recombining the minority carriers (holes) with electrons in the n-type buffer region 2a, whereby the minority carriers (holes) disappear. Therefore, by providing the n-type buffer region 2a, Shockley stacking fault growth with a Shockley-type BPD of the $n^+$-type starting substrate 31 as an origin may be prevented in the epitaxial layers 33, 34 during body diode conduction. Nonetheless, the n-type buffer region 2a may be omitted.

The $n^-$-type drift region 2b is provided between and in contact with the p-type base region 4 and the n-type buffer region 2a (in an instance in which the n-type buffer region 2a is omitted, the $n^+$-type drain region 1). Between the p-type base region 4 and the $n^-$-type drift region 2b, the n-type current spreading region 3 and $p^+$-type regions 21, 22 may be provided. In this instance, the $n^-$-type drift region 2b is a portion of the $n^-$-type epitaxial layer 33 excluding the n-type current spreading region 3 and the $p^+$-type regions 21, 22. The n-type current spreading region 3 and the $p^+$-type regions 21, 22 are provided at deep positions closer to the $n^+$-type drain region 1 than are bottoms of the trenches 7.

The n-type current spreading region 3 constitutes a so-called current spreading layer (CSL) that reduces carrier spreading resistance. The $p^+$-type regions 21, 22 have a function of mitigating electric field applied to the gate insulating films 8 at the bottoms of the trenches 7. The $p^+$-type regions 21 are provided separately from the p-type base region 4 and face the bottoms of the trenches 7 in a depth direction, respectively. The $p^+$-type regions 21 may be in contact with the bottoms of the trenches 7, respectively. One of the $p^+$-type regions 22 is provided between an adjacent two of the trenches 7, separately from the trenches 7 and the $p^+$-type regions 21, and in contact with the p-type base region 4.

The p-type base region 4 is provided between the front surface of the semiconductor chip 30 and the $n^-$-type drift region 2b. The p-type base region 4 is a portion of the p-type epitaxial layer 34 excluding the $n^+$-type source regions 5 and the $p^{++}$-type contact regions 6. The $n^+$-type source regions 5 and the $p^{++}$-type contact regions 6 are selectively provided between the front surface of the semiconductor chip 30 and the p-type base region 4. The $n^+$-type source regions 5 and the $p^{++}$-type contact regions 6 are in contact with the p-type base region 4 and are in ohmic contact with ohmic electrodes 13 in contact holes of a later-described interlayer insulating film 11.

The body diode of the MOSFET is formed by the pn junction 36 between the $p^{++}$-type contact regions 6, the p-type base region 4, the $p^+$-type regions 21, 22 (in FIG. 4, these p-type regions are collectively depicted in as the single $p^+$-type region 37), and the n-type current spreading region 3, the $n^-$-type drift region 2b, the n-type buffer region 2a, and the $n^+$-type drain region 1 (in FIG. 4, the $n^+$-type region 38). Voltage that is negative with respect to the front electrode 14 is applied to the back electrode 15 when the MOSFET is off, thereby, enabling current to pass through the body diode in the forward direction. For example, the body diode may be used as a freewheeling diode (FWD) for passing and regenerating current through the MOSFET in a reverse direction of voltage applied to an inverter or the like.

The $p^{++}$-type contact regions 6 may be omitted. In an instance in which the $p^{++}$-type contact regions 6 are omitted, instead of the $p^{++}$-type contact regions 6, the p-type base region 4 are in ohmic contact with the ohmic electrodes 13. The n-type current spreading region 3, the $p^+$-type regions 21, 22, the $n^+$-type source regions 5, and the $p^{++}$-type contact regions 6 are diffused regions formed by ion implantation and are selectively provided in the epitaxial layer 35. The trenches 7 penetrate through the $n^+$-type source regions 5 and the p-type base region 4 and reach the n-type current spreading region 3 (in an instance in which the n-type current spreading region 3 is omitted, the $n^-$-type drift region 2b).

In the trenches 7, the gate electrodes 9 are provided via the gate insulating films 8. The gate electrodes 9 are electrically connected to a gate pad 61 via a gate runner 62 and a gate finger 63 (refer to FIGS. 6 and 7y The gate pad 61 is a metal wiring layer provided at a same level as the front electrode 14. The gate runner 62 and the gate finger 63 are conductive layers provided on the front surface of the semiconductor chip 30 via a field oxide film. The gate runner 62 is provided in an outer peripheral portion from the active region 41, along the border 43 between the active region 41 and the edge termination region 42 and surrounds a periphery of a center portion where the device element structure of the active region 41 is provided.

The gate finger 63, for example, extends linearly passing though the center of the semiconductor chip 30. The interlayer insulating film 11 is provided on the front surface of the semiconductor chip 30 and covers the gate electrodes 9. In an entire area between the interlayer insulating film 11 and the later-described front electrode 14, for example, a barrier metal 12 that prevents diffusion of metal atoms of the front electrode 14, in a direction from the front electrode 14 to the gate electrodes 9 may be provided. The ohmic electrodes 13 are constituted by a silicide film provided on the front surface of the semiconductor chip 30, in the contact holes of the interlayer insulating film 11. The ohmic electrodes 13 are electrically connected to the p-type base region 4, the $n^+$-type source regions 5, and the $p^{++}$-type contact regions 6.

The front electrode 14 is provided in substantially an entire area of the front surface of the semiconductor chip 30, in the active region 41, so as to be embedded in the contact holes of the interlayer insulating film 11. The front electrode 14 is electrically connected to the p-type base region 4, the $n^+$-type source regions 5, and the $p^{++}$-type contact regions 6, via the ohmic electrodes 13. The barrier metal 12, the ohmic electrodes 13, and the front electrode 14 function as a source electrode. The back electrode 15 is provided in an entire area of the back surface of the semiconductor chip 30 (back surface of the $n^+$-type starting substrate 31) and is electrically connected to the $n^+$-type drain region 1. The back electrode 15 functions as a drain electrode.

Figure 5:
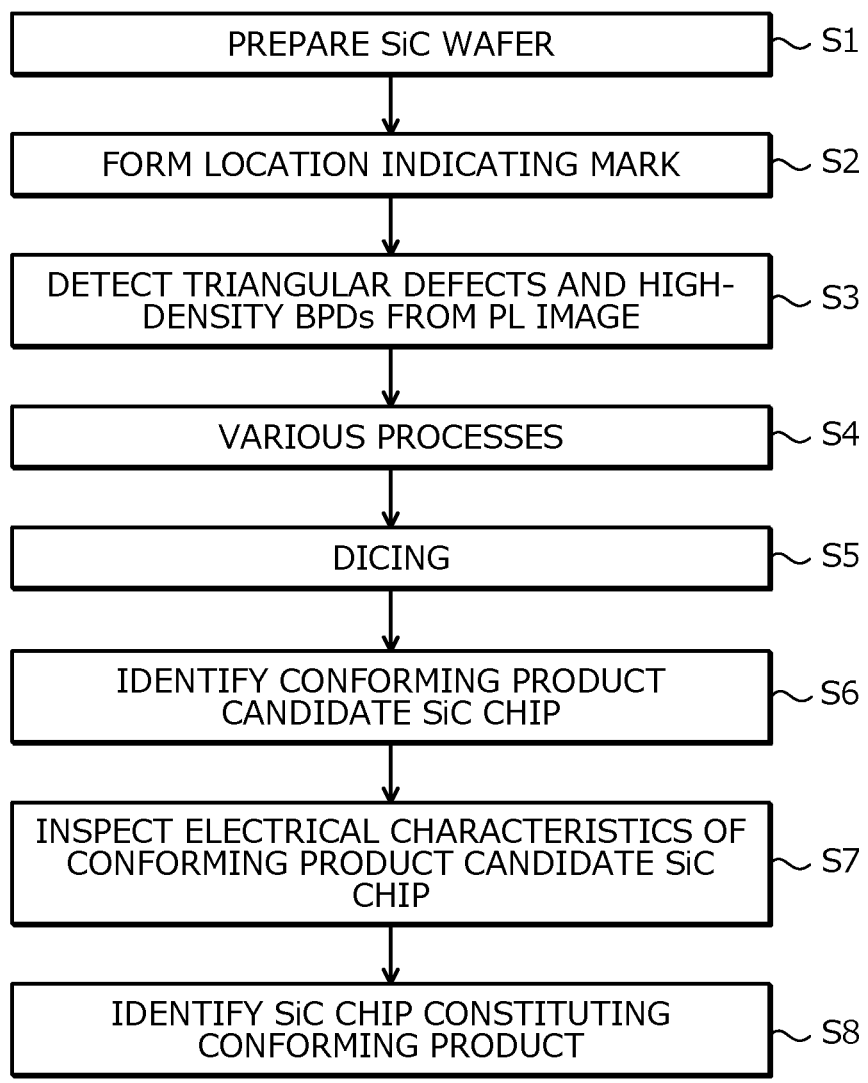
FIG. 5 is a flowchart of an outline of a method of manufacturing the silicon carbide semiconductor device according to the embodiment.

Next, a method of manufacturing the silicon carbide semiconductor device 10 according to the embodiment is described. FIG. 5 is a flowchart of an outline of the method of manufacturing the silicon carbide semiconductor device according to the embodiment. FIGS. 6 and 7 are diagrams schematically depicting shapes of crystal defects detected by a process at step S3 in FIG. 5. Of the multiple chip regions 51 formed in the semiconductor wafer 50, FIGS. 6 and 7 depict a chip region 51a in which the stacking fault 71 associated with the high-density BPDs 72 is generated and a chip region 51b adjacent to the chip region 51a and to which the high-density BPDs 72 are propagated from the chip region 51a. FIGS. 6 and 7 depict an instance in which the chip region 51b is a conforming product and an instance in which the chip region 51b is a non-conforming product, respectively.

First, the semiconductor wafer (SiC wafer) 50 containing silicon carbide as a semiconductor material is prepared (step S1: preprocess). The semiconductor wafer 50 is formed by epitaxially growing an epitaxial layer (corresponds to the epitaxial layer 35 in FIG. 3) on a starting wafer (corresponds to the n$^+$-type starting substrate 31 in FIG. 3) containing silicon carbide. In the process at step S1, the semiconductor wafer 50 may be fabricated by preparing the starting wafer containing silicon carbide or the semiconductor wafer 50 itself may be purchased. Next, location identifying marks (not depicted) are formed at a main surface (surface of the epitaxial layer 35) of the semiconductor wafer 50 (step 32).

In the process at step S2, in the dicing lines 52, a location identifying mark (not depicted) is formed at the main surface of the semiconductor wafer 50 by photolithography and etching. The location identifying mark is a reference for identifying a location (coordinates in directions parallel to the wafer surface) of a crystal defect of the semiconductor wafer 50. In an instance in which the dicing lines 52 are not formed in the semiconductor wafer 50 prepared by the process at step S1, the dicing lines 52 (refer to FIG. 1) suffice to be formed at the main surface of the semiconductor wafer 50 by photolithography and etching, after the process at step S1 but before the process at step S2.

Next, the size (length, surface area, etc.) and location information of the triangular polymorph stacking fault 71 and the high-density BPDs 72 associated with the stacking fault 71 in the epitaxial layer 35 are detected from a PL image of the semiconductor wafer 50 by the crystal defect inspection equipment (step S3: detection process). In the process at step S3, after the stacking fault 71 appearing at the surface of the semiconductor wafer 50 is detected from a DIC image of the semiconductor wafer 50 by the crystal defect inspection equipment, the size and location information of the high-density BPDs 72 in a vicinity of the stacking fault 71 may be obtained using the PL image. The size and location information of the crystal defect suffices to be obtained based on a location identifying mark.

Next, various processes for forming a predetermined device element structure (for example, refer to FIG. 3) in each of the chip regions 51 of the semiconductor wafer 50 are performed (step S4: formation process). At this time, after a process at later-described step S6, formation of the device element structure in each of the chip regions 51 constituting a non-conforming chip may be omitted. Next, the semiconductor wafer 50 is cut (diced) along the dicing lines 52 (bold lines), whereby the chip regions 51 are cut into the individual semiconductor chips 30 (SiC chips, refer to FIG. 2) (step 35: cutting process). Next, based on the information obtained by the process at step 33, the semiconductor chips 30 that are conforming product candidates are identified (step S6: first identification process).

In particular, in the process at step S6, the semiconductor chips 30 satisfying the following two conditions (the two conforming product standards described above) are identified as conforming product candidates. A first condition is that the triangular polymorph stacking fault 71 is not contained. A second condition is that the high-density BPDs 72 do not penetrate (are not propagated) from the adjacent chip region 51a (not depicted), or the high-density BPDs 72 penetrating from the adjacent chip region 51a terminate between the chip end and the specified position 44 (the chip region 51b in FIG. 6). The limit position for Shockley stacking fault growth dependent on the hole injection amount to the high-density BPDs 72 is obtained in advance according to the device element structure and is assumed to be the specified position 44.

The semiconductor chips 30 containing the triangular polymorph stacking fault 71 (the chip region 51a) and/or penetrated by the high-density BPDs 72 from the adjacent chip region 51a, the high-density BPDs 72 penetrating closer to the chip center than is the specified position 44 (the chip region 51b in FIG. 7) are removed as non-conforming chips. Therefore, in the process at step S3, the position of the chip region 51a containing the triangular polymorph stacking fault 71 and a termination position of the high-density BPDs 72 extending into the adjacent chip region 51b from the stacking fault 71 in the chip region 51a are obtained. The chip region 51b free of the triangular polymorph stacking fault 71 and free of the high-density BPDs 72 in a portion in or closer to the chip center than is the specified position 44 (refer to FIG. 6) constitutes a semiconductor chip 30 that is a conforming product candidate.

Next, for each of the semiconductor chips 30 that is a conforming product candidate, on-voltage characteristics, breakdown voltage characteristics, electrical characteristics such as leak current characteristics are inspected by a general reliability test (step 37: inspection process). In the process at step S7, other various tests for evaluating or confirming conditions not affecting tolerance capability or reliability may be performed. The process and other tests at step S7 may be performed after the process at step S5 but before the process at step S6 in an instance in which it is not problematic even when performed to the semiconductor wafer 50. Next, based on results from step 37, the semiconductor chips 30 constituting conforming products (conforming chips) are identified (step 38: second identification process), whereby the silicon carbide semiconductor device 10 is completed.

In the method of manufacturing the silicon carbide semiconductor device 10 according to the embodiment described above, the processes at steps S7 and S8 may be omitted, and the semiconductor chips 30 identified by the process at step S6 may be assumed to be conforming products. Further, in an instance in which the n-type current spreading region 3 and the p$^+$-type regions 21, 22 of the silicon carbide semiconductor device 10 are formed, during the process at step 31, after the n$^-$-type epitaxial layer 33 constituting the n$^-$-type drift region 2b is epitaxially grown but before the p-type epitaxial layer 34 constituting the p-type base region 4 is epitaxially grown, the n-type current spreading region 3 and the p$^+$-type regions 21, 22 may be selectively formed in the n$^-$-type epitaxial layer 33 by ion implantation.

The method of manufacturing the silicon carbide semiconductor device 10 described by the present embodiment may be realized by executing a prepared program on a computer such as a personal computer or a workstation, a database server, a webserver, etc. The program, the size and location information obtained for crystal defects by the process at step S3, etc. are recorded to a computer-readable recording medium such as a solid-state drive (SSD), a hard drive, a Blu-ray (registered trademark) disc (BD), a flexible disk, a USB flash memory, a CD-ROM, a MO, a DVD, etc., and the program is executed by being read out by the computer. Further, the program may be a transmission medium that may be distributed via a network such as the Internet.

As described above, according to the embodiment, triangular polymorph stacking faults and high-density BPDs generated in the epitaxial layer of the semiconductor wafer are detected by a PL image from the crystal defect inspection equipment. A position that is a distance equivalent to about 60% of the length of the edge termination region, in the horizontal direction toward the chip end, from the border between the active region and the edge termination region is obtained in advance as the specified position. Further, a semiconductor chip free of triangular polymorph stacking faults and free of high-density BPDs in a portion (the active region and the voltage withstanding structure) in or closer to the chip center than is the specified position are assumed as conforming products (or conforming product candidates). The semiconductor chips assumed to be conforming products may contain high-density BPDs in an area thereof closer to the chip end than is the specified position.

Therefore, semiconductor chips that contain high-density BPDs and thus, may have decreased reliability may be prevented from entering the market. As a consequence, reliability may be enhanced as compared to the conventional method of only detecting surface abnormalities (uneven surface) of the semiconductor chip using a DIC image (refer to FIG. 11A). Further, by setting a range (area in or closer to the chip center than is the specified position) that must be free of high-density BPDs, semiconductor chips that may achieve predetermined characteristics even while containing high-density BPDs may be identified as conforming products. Therefore, the yield may be enhanced as compared to the conventional method of removing all semiconductor chips that contain high-density BPDs (refer to FIG. 11B).

Further, according to the embodiment, the range (specified position) that must be free of high-density BPDs may be suitably set according to the device element structure and therefore, application to an existing device element structure requires no design changes for the existing device element structure.

The distance (hereinafter, hole diffusion distance) w2, in the horizontal direction, between the border 43 of the active region 41 and the edge termination region 42, and the limit position (the specified position 44) that the hole current, which flows toward the chip end from the pn junction 36 of the active region 41 during body diode conduction, reaches having a hole density high enough to contribute to Shockley stacking fault growth was verified. FIG. 8 is a table of measurement results for the hole diffusion distance in experimental examples. FIG. 9 is a table of calculation results for hole diffusion distance ratios in the experimental examples. Measurement results for the hole diffusion distance w2 of MOSFETs (hereinafter, experimental examples) having the structure of the silicon carbide semiconductor device 10 according to the embodiment described above (refer to FIGS. 2 to 4) are shown in FIG. 8.

As the experimental examples, samples (hereinafter, first to fifth samples) for which combinations of breakdown voltage and body diode conduction conditions differed were prepared. The breakdown voltage of the first and the second samples was assumed to be 1.2 kV, the breakdown voltage of the third sample was assumed to be 1.7 kV, and the breakdown voltage of the fourth and the fifth samples was assumed to be 3.3 kV. In the samples for which the breakdown voltages are the same (the first and the second samples, the fourth and the fifth samples), the respective thicknesses t1 of the n$^-$-type drift regions 2b were equal to each other. As depicted in FIG. 8, for the first to the fifth samples, forward current (height of current pulse) during body diode conduction, junction temperature (temperature of heat generated near the pn junction 36), duty ratio (ratio of off-time to on-time of current pulse), and conduction time were set.

From the results for the fourth and the fifth samples shown in FIG. 8, it was confirmed that independent of body diode conduction conditions (forward current, the junction temperature, the duty ratio, and the conduction time), provided the breakdown voltages are the same, the lengths w1 of the edge termination regions 42 are about the same and therefore, the hole diffusion distances w2 are about the same. Further, from the results for the fourth and the fifth samples shown in FIG. 8, it was confirmed that the hole diffusion distance w2 is dependent on the thickness t1 of the n$^-$-type drift region 2b and the thicker is the thickness t1 of the n$^-$-type drift region 2b, the longer is the hole diffusion distance w2. In other words, the hole diffusion distance w2, similarly to the length w1 of the edge termination region 42, is dependent on the thickness t1 of the n$^-$-type drift region 2b, the rated breakdown voltage, and the voltage withstanding structure 16.

For the first, the third, and the fourth samples of the experimental examples, calculation results of the ratio of the hole diffusion distance w2 to the length w1 of the edge termination region 42 (=w2/w1) are shown in FIG. 9. Results for the second and the fifth examples are about the same as the results for the first and the fourth examples. From the results shown in FIG. 9, it was confirmed that in all of the first to the fifth samples, the hole diffusion distance w2 from the border 43 between the active region 41 and the edge termination region 42 in the horizontal direction is about 60% of the length w1 of the edge termination region 42. Therefore, it was confirmed that when the hole diffusion distance w2 for setting the specified position 44 is about 60% of the length w1 of the edge termination region 42, Shockley stacking faults that originate from the high-density BPDs 72 do not grow between the chip end and the specified position 44.

Further, for the second to the fifth examples of the experimental examples, a range in which Shockley stacking faults grow was verified. FIGS. 10A, 10B, 10C and 10D are diagrams schematically depicting states when ranges in which Shockley stacking faults grow in the experimental examples are observed from the front side of the semiconductor chip. In FIGS. 10A to 10D, the border 43 between the active region 41 and the edge termination region 42 is indicated by a fine dashed line and the specified position 44 is indicated by a coarse dashed line. Reference numerals 61, 63, and 64 are a gate pad, a gate finger, and an electrode pad for gate resistance measurement, respectively. In FIGS. 10A to 10D, the gate runner 62 (refer to FIGS. 6 and 7) is not depicted. Chip sizes (sizes of the semiconductor chips 30) of the second to the fifth examples differed among the examples.

States of Shockley stacking faults 91 (hatched portions) grown by body diode conduction in the second to the fifth examples of the experimental examples observed in PL images by crystal defect inspection equipment are shown in FIGS. 10A to 10D, respectively. From the results shown in FIGS. 10A to 10D, it was confirmed that in all of the second to the fifth examples, the Shockley stacking faults 91 grow toward the chip end, from the active region 41, extend beyond the border 43 between the active region 41 and the edge termination region 42, and terminate at predetermined positions in the edge termination region 42. The hole injection amount necessary for growth of the Shockley stacking faults 91 is presumed to be constrained by the distance in the horizontal direction (growth direction) or the device element structure of the active region 41.

Therefore, in the edge termination region 42, a position where the growth of the Shockley stacking faults 91 terminates is obtained in advance and assumed as the specified position 44. For the chip region 51b penetrated by the high-density BPDs 72 from the adjacent chip region 51a (the chip region 51 where triangular polymorph stacking fault is generated), termination positions of the high-density BPDs 72 are detected by a PL image from the crystal defect inspection equipment. It was confirmed that when the high-density BPDs 72 terminate between the chip end and the specified position 44, the Shockley stacking faults 91 that originate from the high-density BPDs 72 do not grow and therefore, the chip region 51b may be set as a conforming product (refer to FIG. 6).

In the foregoing, the present invention is not limited to the embodiments described and may be variously modified within a range not departing from the spirit of the invention. For example, the present invention may be applied to a Schottky barrier diode (SBD), a p-intrinsic-n (pin) diode, and/or an insulated gate bipolar transistor (IGBT). Further, the present invention is similarly implemented when the conductivity types (n-type, p-type) are reversed.

According to the invention described above, semiconductor chips that contain high-density BPDs (BPDs extending from triangular polymorph stacking faults formed in the epitaxial layer during epitaxial growth) and thus, may have decreased reliability may be prevented from entering the market. Further, by setting a range (area in or closer to the chip center than is the specified position) that must be free of high-density BPDs, semiconductor chips that may achieve predetermined characteristics even while containing high-density BPDs may be identified as conforming products.

The silicon carbide semiconductor device and the method of manufacturing a silicon carbide semiconductor device according to the present invention achieve an effect in that reliability may be enhanced together with yield.

As described above, the silicon carbide semiconductor device and the method of manufacturing a silicon carbide semiconductor device according to the present invention are useful for power semiconductor devices used in power converting equipment, power source devices such as in various types of industrial machines, etc. and are particularly suitable for SiC-MOSFETs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a vertical silicon carbide semiconductor device on one of a plurality of semiconductor chips in which an epitaxial layer is epitaxially grown on a starting substrate containing silicon carbide, the semiconductor chips each having two main surfaces opposite to each other, the vertical silicon carbide semiconductor device having an electrode on each main surface of each semiconductor chip, the method comprising:
   as a preprocess, preparing a semiconductor wafer in which the epitaxial layer is epitaxially grown on a starting wafer that contains silicon carbide and constitutes the starting substrate;
   as a detection process, detecting a crystal defect of the epitaxial layer;
   as a formation process, forming a predetermined device element structure on the semiconductor wafer;
   as a cutting process, dicing the semiconductor wafer into the plurality of semiconductor chips after the formation process; and
   as a first identification process, identifying one or more chips as a conforming product, based on a result of the detection process, wherein
   each of the plurality of semiconductor chips has:
       an active region in which the device element structure is provided, and
       a termination region surrounding a periphery of the active region,
   the detection process includes detecting, in the epitaxial layer, a stacking fault and a basal plane dislocation (BPD) extending from the stacking fault, and
   the first identification process includes identifying, as a conforming product, the one or more chips that are entirely free of the stacking fault and are free of the BPD in a specified area set in advance, the specified area being an area in the termination region and being located closer to a chip center than is a specified position.

2. The method according to claim 1, wherein
   a border between the active region and the termination region is an outer end of a pn junction constituting a main junction of the device element structure, formed in the epitaxial layer, and
   the specified position is a position that is located at a specified distance from the border between the active region and the termination region in a direction that is toward a chip end and parallel to the main surfaces of each of the plurality of semiconductor chips, the specified distance being equal to 60% of a length of the termination region between the border and the chip end.

3. The method according to claim 2, wherein
   a hole current flows so as to spread outward toward the starting substrate from the pn junction during conduction of a diode formed by the pn junction, and
   the specified distance between the border and the specified position is equal to a maximum length from the pn junction that the hole current reaches with maintaining a minimum hole density that enables the hole current to contribute to Shockley stacking fault growth originating at the BPD.

4. The method according to claim 1, wherein
   the detection process includes:
       detecting a position of the stacking fault that is a triangular polymorph formed during epitaxial growth of the epitaxial layer, and
       detecting a termination position of the BPD extending from the stacking fault.

5. The method according to claim 1, wherein
   a plurality of chip regions constituting the plurality of semiconductor chips after the cutting process is provided in the semiconductor wafer, and
   the first identification process includes:
       identifying, as a conforming product of the plurality of semiconductor chips, a first chip constituted by a first chip region free of the stacking fault and free of the BPD, and
       identifying, as a conforming product of the plurality of semiconductor chips, a second chip constituted by a second chip region free of the stacking fault and containing the BPD penetrating therein from a third chip region among the plurality of semiconductor chips and adjacent to the second chip, the BPD terminating closer to a chip end of the second chip than is the specified position in the second chip.

6. The method according to claim 1, wherein the detection process includes detecting the crystal defect by a photo luminescence image of the semiconductor wafer.

7. The method according to claim 1, further comprising:
as an inspection process, inspecting electrical characteristics of the one or more chips identified by the first identification process; and
as a second identification process, identifying, among the one or more chips by the first identification process, a chip satisfying a predetermined characteristic based on a result of the inspection process.

8. The method according to claim 1, wherein the formation process includes forming a voltage withstanding structure between the specified position and a border between the active region and the termination region.

9. A vertical silicon carbide semiconductor device including a semiconductor chip in which an epitaxial layer is epitaxially grown on a starting substrate containing silicon carbide, the semiconductor chip having two main surfaces opposite to each other, an electrode being disposed on each main surface of the semiconductor chip, the device comprising:
an active region provided on the semiconductor chip;
a termination region provided on the semiconductor chip and surrounding a periphery of the active region; and
a predetermined device element structure provided in the active region, wherein
the semiconductor chip:
is free of a triangular polymorph stacking fault in the epitaxial layer, and
is free of a basal plane dislocation (BPD) in a specified area that is in the termination region and is located closer to a chip center than is a specified position, the BPD extending from the stacking fault until between the stacking fault and a perfect crystal during the epitaxial growth.

10. The silicon carbide semiconductor device according to claim 9, further comprising
a pn junction in the epitaxial layer, constituting a main junction of the device element structure, wherein
a border between the active region and the termination region is an outer end portion of the pn junction, and
the specified position is a position that is located at a specified distance from the border between the active region and the termination region in a direction that is toward a chip end and parallel to the main surfaces of the semiconductor chip, the specified distance being equal to 60% of a length of the termination region between the border and the chip end.

11. The silicon carbide semiconductor device according to claim 10, wherein
a hole current flows so as to spread outward toward the starting substrate from the pn junction during conduction of a diode formed by the pn junction, and
the specified distance between the border and the specified position is equal to a maximum length from the pn junction that the hole current reaches with maintaining at least a minimum hole density that enables the hole current to contribute to Shockley stacking fault growth originating at the BPD.

12. The silicon carbide semiconductor device according to claim 9, wherein the semiconductor chip contains the BPD outside the specified area that is located farther from the chip center than is the specified position.

* * * * *